(12) United States Patent
O'Connor et al.

(10) Patent No.: US 9,865,761 B1
(45) Date of Patent: Jan. 9, 2018

(54) EMITTER-LESS, BACK-SURFACE ALTERNATING-CONTACT SOLAR CELL

(71) Applicant: The United States of America, as represented by the Secretary of the Navy, Washington, DC (US)

(72) Inventors: Joseph E. O'Connor, Monterey, CA (US); Sherif Michael, Pebble Beach, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/282,460

(22) Filed: Sep. 30, 2016

Related U.S. Application Data

(63) Continuation-in-part of application No. 15/207,128, filed on Jul. 11, 2016.
(Continued)

(51) Int. Cl.
*H01L 31/0224* (2006.01)
*H01L 31/0304* (2006.01)
(Continued)

(52) U.S. Cl.
CPC .. *H01L 31/0735* (2013.01); *H01L 31/022441* (2013.01); *H01L 31/0304* (2013.01);
(Continued)

(58) Field of Classification Search
CPC ......... H01L 31/022441; H01L 31/0304; H01L 31/03046; H01L 31/0682; H01L 31/0693; H01L 31/0735; Y02E 10/50; Y02E 10/544

See application file for complete search history.

(56) References Cited

U.S. PATENT DOCUMENTS 9,768,329 B1 * 9/2017 Kayes ................. H01L 31/0232
2010/0132780 A1 * 6/2010 Kizilyalli ............ H01L 31/0236
136/255

(Continued)

OTHER PUBLICATIONS

Bauhuis et al., "26.1% thin-film GaAs solar cell using epitaxial lift-off," Solar Energy Materials & Solar Cells 93 (2009).
(Continued)

*Primary Examiner* — Lindsey Bernier
(74) *Attorney, Agent, or Firm* — Naval Postgraduate School; James B. Potts

(57) ABSTRACT

The disclosure provides an emitter-less solar cell design featuring p-or-n type GaAs with alternating p-n junction regions on the back-surface of the cell, opposite incident solar irradiance. Various layers of p-or-n type GaAs are interfaced together to collect charge carriers, and a thin layer of AlGaAs is applied to the front and back surfaces to prevent recombination of charge carriers. In some embodiments, the layered and doped structure generally provides an AlGaAs window layer of about 20 nm doped to about $3\times(10^{18})$ cm$^{-3}$, a GaAs absorption layer of about 1200 nm doped to about $2\times(10^{17})$ cm$^{-3}$, an AlGaAs heterojunction layer of about 20 nm doped to about $3\times(10^{18})$ cm$^{-3}$, and a GaAs contact layer of about 20 nm doped to about $1\times(10^{19})$ cm$^{-3}$. Additionally, AlGaAs BSF-heterojunction layer and GaAs BSF-contact layers each have a depth of about 20 nm and are doped to about $3\times(10^{18})$ cm$^{-3}$ and $1\times(10^{19})$ cm$^{-3}$ respectively. The heterojunction layer, and contact layer are doped to a conductivity type opposite the absorption layer.

16 Claims, 3 Drawing Sheets

Related U.S. Application Data

(60) Provisional application No. 62/331,552, filed on May 4, 2016.

(51) Int. Cl.
*H01L 31/068* (2012.01)
*H01L 31/0735* (2012.01)
*H01L 31/0352* (2006.01)
*H01L 31/0693* (2012.01)

(52) U.S. Cl.
CPC .......... *H01L 31/03046* (2013.01); *H01L 31/035272* (2013.01); *H01L 31/0682* (2013.01); *H01L 31/0693* (2013.01); *Y02E 10/50* (2013.01); *Y02E 10/544* (2013.01)

(56) References Cited

U.S. PATENT DOCUMENTS

2012/0103406 A1* 5/2012 Kayes ............ H01L 31/022425 136/256
2012/0104460 A1* 5/2012 Nie .................... H01L 31/0735 257/184

OTHER PUBLICATIONS

Kayes et al., "27.6% conversion efficiency, a new record for single junction solar cells under 1 sun illumination," Proc. IEEE Photovoltaic Specialist Conference, 2011, pp. 4-8.
Baca et al, "A survey of ohmic contacts to III-V compound semiconductors," Thin Solid Films 308-309 (1997).
(Unknown author) Atlas 2D and 3D Device Simulator: Detailed Overview, available at http://www.silvaco.com/content/kbase/atlas_detailed_overview.pdf, last accessed Sep. 29, 2016.
Wang et al, "Design of GaAs Solar Cells Operating Close to the Shockley-Queisser Limit," IEEE Journal of Photovoltaics, vol. 3, No. 2, Apr. 2013.
Shockley et al., "Detailed Balance Limit of Efficiency of p-n Junction Solar Cells," J. Appl. Phys., vol. 32, No. 3 (1961).
Lush et al, "Determination of minority carrier lifetimes in n-type GaAs and their implications for solar cells," IEEE Photovoltaic Specialist Conference, 1991, pp. 182-187.
Steiner et al, "Effects of Internal Luminescence and Internal Optics on Voc and Jsc of III-V Solar Cells," IEEE Journal of Photovoltaics, vol. 3, No. 4, Oct. 2013.
Zhang, "High efficiency GaAs-based solar cells simulation and fabrications," Master's Thesis, Arizona State University, Tempe, AZ, May 2014.
Walker et al, "Impact of Photon Recycling on GaAs Solar Cell Designs," IEEE Journal of Photovoltaics, vol. 5, No. 6, Nov. 2015.
Skauli, "Improved dispersion relations for GaAs and applications to nonlinear optics," Journal of Applied Physics, vol. 94, No. 10 (2003).
Lumb et al, "Incorporating photon recycling into the analytical drift-diffusion model of high efficiency solar cells," Journal of Applied Physics 116, 194504 (2014).
Kayes et al., "Light management in single-junction III-V solar cells," Organic Photonic + Electronics Conference, unpublished presentation, Aug. 2012.
Ahrenkiel, "Measurement of minority-carrier lifetime by time-resolved photoluminescence," Solid State Elec., vol. 35, No. 3, pp. 239-250, 1992.
Aspnes et al, "Optical properties of AlxGa1-xAs," J. Appl. Phys. vol. 60, pp. 754-767, 1986.
Miller et al., "Photon extraction, the key physics for approaching solar cell efficiency limits," in Proc. of SPIE, vol. 8808, 2013, pp. 1-10.
Blakemore et al, "Semiconducting and other major properties of gallium arsenide," J. Appl. Phys. vol. 53, No. 10, pp. R123-R181, 1982.
Schroder et al, "Solar cell contact resistance—a review," IEEE Trans. on Elec. Dev,, vol. 31, No. 5, pp. 637-647, 1984.
Green et al., "Solar cell efficiency tables (version 40)," Prog. in Photovoltaics Res. and Appl., vol. 20, No. 1, pp. 606-614, 2012.
Green et al, "Solar cell efficiency tables (version 47)," Prog. in photovoltaics research and applications, vol. 24, No. 1, pp. 3-11, 2016.
Miller et al, "Strong Internal and External Luminescence as Solar Cells Approach the Shockley-Queisser Limit," IEEE Journal of Photovoltaics, vol. 2, No. 3, Jul. 2012.
Yablonovich, "The optoelectronic physics that just broke the efficiency record in solar cells," Stanford Energy Seminar, Sep. 2011.
Ren et al., "Use of Sn-doped GaAs for non-alloyed ohmic contacts to HEMTs," Elec. Lett, vol. 30, p. 912, 1994.
Kerschaver et al., "Back-contact Solar Cells: A Review," Prog. Photovolt: Res. Appl. 14 (2006).
Belghachi et al., "Effect of the front surface field on GaAs solar cell photocurrent," Solar Energy Materials & Solar Cells 92 (2008).
Ho et al., "Optimization of All-Back-Contact GaAs Solar Cells," 2015 International Conference on Numerical Simulation of Optoelectronic Devices (NUSOD) (2015).
Kerns et al., "The design of radiation-hardened ICs for space: a compendium of approaches," Proceedings of the IEEE 76(11) (1988).
Miller et al., "Strong internal and external luminescence as solar cells approach the Shockley-Queisser limit," IEEE Journal on Photovoltaics 2(3) (2012).
Silverman et al., "Outdoor performance of a thin-film gallium-arsenide photovoltaic module," Proc. IEEE Photovoltaic Specialist Conference (2013).
Singh et al., "Temperature dependence of solar cell performance—an analysis," Solar Energy Materials & Solar Cells (2012).
Wang et al., "Approaching the Schockley-Queisser limit in GaAs solar cells," IEEE Photovoltaic Specialist Conference (2012).
"Single Junction Solar Cells—Photovoltaics Lab IOFFE," available at http://pvlab.ioffe.ru/about/solar_cells.html, last accessed Jul. 12, 1016.
Mattos et al., "New module efficiency record: 23.5% under 1-sun illumination using thin-film single-junction GaAs solar cells," IEEE Photovoltaic Specialist Conference (2012).
Cruz-Campa et al., "Back-contacted and small form factor GaAs solar cell," IEEE Photovoltaic Specialist Conference (2010).
Granek, "High-efficiency back-contact back-junction silicon solar cells," Ph.D. dissertation, Faculty of Engineering, University of Freiburg, Germany (2009).
Zhou et al., "Design of GaAs solar cell front surface anti-reflection coating," IEEE Vehicular Electronics and Safety Conference (2013).
Saylan et al., "Multilayer antireflection coating design for GaAsP/Si dual-junction solar cells," Solar Energy 122 (2015).
Perl et al., "Ultrabroadband and wid-angle hybrid antireflection coatings with nanostructurs," IEEE Journal of Photovoltaics 4(3) (2014).
Padilla et al., "Characterizing local contact resistance of interdigitated back contact silicon solar cells," European PV Solar Energy Conference and Exhibition (2014).
Macherzynski et al., "Fabrication of ohmic contact based on platinum to p-type compositionally graded AlGaAs layers," Journal of Physics: Conference Series 146 (2009).

\* cited by examiner

EMITTER-LESS, BACK-SURFACE ALTERNATING-CONTACT SOLAR CELL

RELATION TO OTHER APPLICATIONS

This patent application claims priority from provisional patent application 62/331,552 filed May 4, 2016 and from nonprovisional patent application Ser. No. 15/207,128 filed Jul. 11, 2016, which are hereby incorporated by reference in their entirety.

FIELD OF THE INVENTION

One or more embodiments relates to an emitter-less solar cell design featuring p-or-n type Gallium-Arsenide (GaAs) or other direct band gap semiconductor and aluminum-gallium-arsenide (AlGaAs) or other wide band gap semiconductor with alternating p-n junction regions on the back-surface of the cell.

BACKGROUND

Solar cells produce electric current and voltage in order to power an external load, and a primary goal of solar cell design is to increase power output while balancing manufacturing cost. Due to the widespread availability and low cost of silicon versus other semiconductor materials, it has remained the overwhelming choice for solar cell manufacturers. However, since silicon is an "indirect band gap" semiconductor, energy (heat) must be exchanged with the crystal lattice in the form of phonons in order to free electrons. Silicon only uses a portion of the solar spectrum to free electrons. Much of the remaining spectrum energy is absorbed by the crystal lattice, which causes the temperature of the solar cell to rise during normal operation. Additionally, the low surface-state density characteristic of silicon makes it susceptible to radiation damage over time, especially in outer-space applications. High energy particles from the sun create intermediate energy states in a solar cell which lead to higher recombination rates and lower efficiency.

Surface-state density of Gallium Arsenide (GaAs) is much larger than silicon, and the material is inherently harder to total-dose radiation. See Kerns et al., "The design of radiation-hardened ICs for space: a compendium of approaches," *Proceedings of the IEEE* 76(11) (1988). GaAs is a "direct band gap" semiconductor that absorbs photon energy and free electrons without transferring momentum, and less heat is absorbed in the crystal lattice. This generates significant improvements for solar cell design such as lower operating temperatures in a given environment. See Silverman et al., "Outdoor performance of a thin-film gallium-arsenide photovoltaic module," *Proc. IEEE Photovoltaic Specialist Conference* (2013). GaAs provides additional advantages over silicon including thinner absorbing layers, which improves flexibility and reduces weight. Additionally, GaAs cells maintain performance advantages as irradiance decreases. Generally, high-efficiency GaAs cells produce about 20% more power than high-efficiency silicon cells at room temperature, and about 28% more power at typical operating temperatures. See Reich et al., "Weak light performance and spectral response of different solar cell types," *Proc. 20th European Photovoltaic Solar Energy Conference* (2005).

Further advantages in solar cell operation may accrue through the placement of all electrical contacts on the back-surface of the solar cell, which improves both the optical and electrical performance of the solar cell since shading is eliminated and robust electrical contacts may be used to decrease serial resistance. To date, back-surface contact solar cell designs have focused almost exclusively on silicon as the semiconductor of choice.

It would be advantageous to provide a GaAs-based solar cell having relatively optimized layer structure and doping concentrations for back-surface contact operation. Such a solar cell would provide significant advantage over silicon-based cells while additionally providing the advantages associated with back-surface contact placement. It would also be advantageous to provide a GaAs-based solar cell that does not have an emitter layer. Such a solar cell would be easier and cheaper to manufacture while additionally proving performance advantages.

These and other objects, aspects, and advantages of the present disclosure will become better understood with reference to the accompanying description and claims.

SUMMARY

The disclosure provides an Emitter-less, Back-surface, Alternating-Contact (EBAC) solar cell featuring p-or-n type GaAs with alternating p-n junction regions on the back-surface of the cell. Various layers of p-or-n type GaAs are interfaced together to collect charge carriers, and a thin layer of AlGaAs is applied to the front and back surfaces to minimize recombination of charge carriers. Highly reflective, back-surface, metal contacts are used to reflect photons back into the absorption layer and improve optical and electrical performance.

The EBAC solar cell provides a layered structure including a window layer comprising AlGaAs and an absorption layer comprising GaAs, with the window and absorption layers doped to a first conductivity type such as p or n. A heterojunction layer comprising AlGaAs and a contact layer comprising GaAs. The heterojunction layer and contact layer are doped to a conductivity type opposite the absorption layer. A contact couples to the contact layer. The EBAC solar cell additionally includes a Back-Surface-Contact (BSF)-heterojunction layer comprising AlGaAs and adjacent to the absorption layer, followed by a BSF-contact layer comprising GaAs. The BSF-heterojunction layer and BSF-contact layer are doped to the first conductivity type of the absorption layer, and another contact is coupled to BSF-contact layer. The EBAC solar cell further comprises a gap with or without an insulator (insulator gap) separating the heterojunction layer and contact layer from the BSF-heterojunction layer and BSF-contact layers.

In particular embodiments, the disclosed layers have complementing depths and doping concentrations in order to provide advantageous operation of the EBAC solar cell. In some embodiments, the window layer has a depth of about 20 nanometers (nm), the absorption layer has a depth of about 1200 nm, the heterojunction layer has a depth of about 20 nm, and the contact layer has a depth of about 20 nm. Additionally, the BSF and BSF-contact layers each have a depth of about 20 nm. In other embodiments the window layer has a doping concentration of about $3 \times (10^{18})$ cm$^{-3}$, the absorption layer has a doping concentration of about $2 \times (10^{17})$ cm$^{-3}$, the heterojunction layer has a doping concentration of about $3 \times (10^{18})$ cm$^{-3}$, and the contact layer has a doping concentration of about $1 \times (10^{19})$ cm$^{-3}$, while the BSF-heterojunction layer has a doping concentration of about $3 \times (10^{18})$ cm$^{-3}$ and the BSF-contact layer has a doping concentration of about $1 \times (10^{19})$ cm$^{-3}$.

The novel apparatus and principles of operation are further discussed in the following description.

Embodiments in accordance with the invention are further described herein with reference to the drawings.

DETAILED DESCRIPTION OF THE INVENTION

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide an emitter-less solar cell design featuring p-or-n type GaAs with alternating p-n junction regions on the back-surface of the cell.

The disclosure provides a novel emitter-less solar cell design featuring p-or-n type GaAs with alternating p-n junction regions on the back-surface of the cell, opposite incident solar irradiance. Various layers of p-or-n type GaAs are interfaced together to collect charge carriers, and a thin layer of AlGaAs is applied to the front and back surfaces to prevent recombination of charge carriers. Layer properties (thickness, material, doping, etc.) are generally optimized to improve overall conversion efficiency. Highly reflective, back-surface, metal contacts are used to reflect photons and improve optical and electrical performance. Other advantages include better long-term performance in high-radiation environments; higher conversion efficiency at elevated temperatures; and a lighter, more flexible structure for mobile applications.

Figure 1:
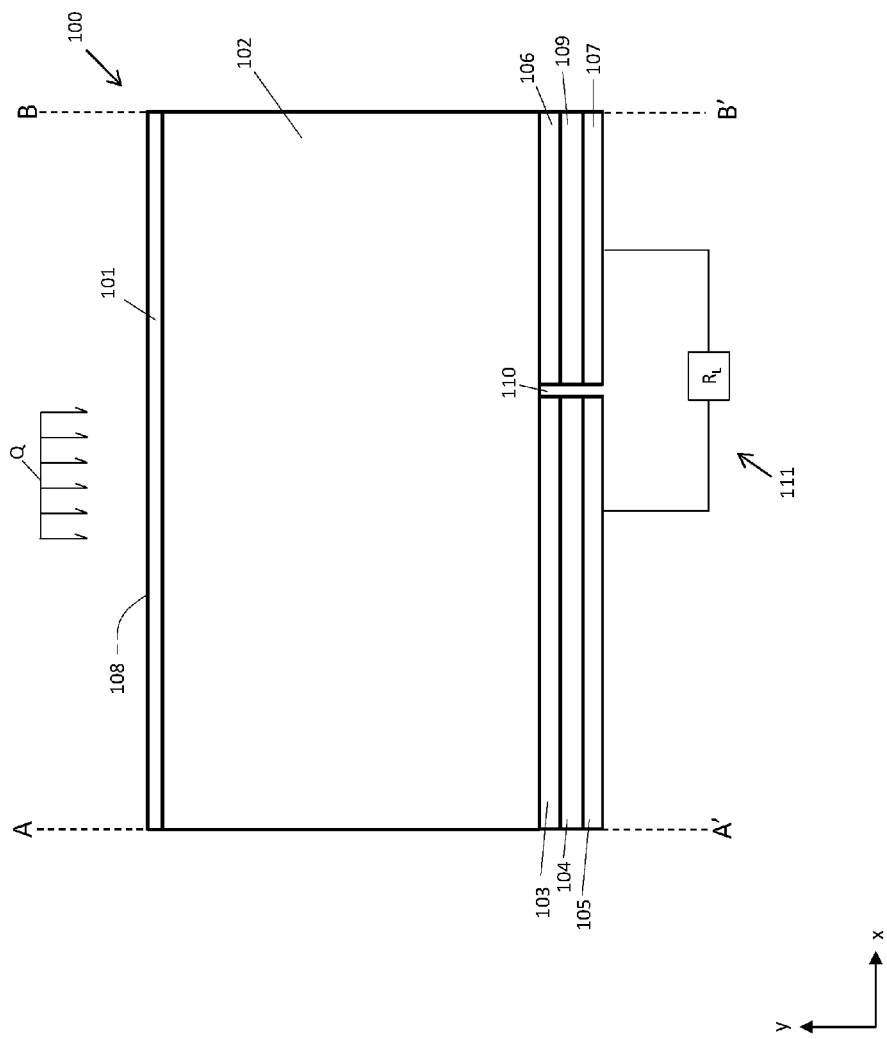
FIG. 1 illustrates an embodiment of the EBAC solar cell.

FIG. 1 illustrates the EBAC solar cell generally at 100 and generally intended to receive a solar irradiance Q. EBAC solar cell 100 comprises a plurality of stacked layers including window layer 101, absorption layer 102, BSF-heterojunction layer 106, BSF-contact layer 109, and first contact 107, as well as heterojunction layer 103, contact layer 104, and second contact 105. FIG. 1 generally provides a section of EBAC solar cell 100 illustrated between axes A-A' and B-B' which is generally repeated across the EBAC solar cell disclosed. In certain embodiments, EBAC solar cell 100 further comprises anti-reflective coating 108. Note that all layers of this embodiment have smooth surfaces; however, another embodiment may texture one or more surface or interface to enhance or reduce photons reflection and improve performance. Typically for EBAC solar cell 100, window layer 101, absorption layer 102, BSF-heterojunction layer 106 and BSF-contact layer 109 are doped to a first conductivity type such as p-type, and heterojunction layer 103, and contact layer 104 are doped to a second conductivity type such as n-type. Alternatively, window layer 101, absorption layer 102, BSF-heterojunction layer 106, and BSF-contact layer 109 may be doped to n-type, while heterojunction layer 103, and contact layer 104 may be doped to p-type. Both arrangements are contemplated within this disclosure. Here and elsewhere, "conductivity type" refers to a property that identifies the majority charge carrier in a semiconductor material, where the majority current carriers in n-type material are electrons and the majority current carriers in p-type material are holes. See e.g. K. Rajeshwar, *Fundamentals of Semiconductor Electrochemistry and Photochemistry* (2007), among others.

At FIG. 1, window layer 101 comprises AlGaAs. Absorption layer 102 is adjacent to and generally in contact with window layer 101 and comprises GaAs. BSF-heterojunction layer 106 is adjacent to and generally in contact with absorption layer 102 and comprises AlGaAs. BSF-contact layer 109 is adjacent to and generally in contact with BSF-heterojunction layer 106 and comprises GaAs. First contact 107 is coupled to BSF-contact layer 109 and comprises a metal. In a particular embodiment, first contact 107 comprises a single layer of metal or multiple layers of various metals to achieve low contact resistivity on the order of $<10^3$ $\Omega\text{-cm}^{-2}$. Further at FIG. 1, heterojunction layer 103 is adjacent to and generally in contact with absorption layer 102 and comprises AlGaAs. Contact layer 104 is adjacent to and generally in contact with heterojunction layer 103 and comprises GaAs. Second contact 105 is coupled to contact layer 104 and comprises a metal. In a particular embodiment, second contact 105 comprises a single layer of metal or multiple layers of various metals to achieve low contact resistivity on the order of $<10^3$ $\Omega\text{-cm}^{-2}$. Solar cell 100 further comprises an insulator gap 110 generally comprising an insulating material and separating heterojunction layer 103, contact layer 104, and second contact 105 from BSF-heterojunction layer 106, BSF-contact layer 109, and first contact 107. First contact 107 and second contact 105 are typically present in EBAC solar cell 100 as interdigitated contacts.

The window layer 101, absorption layer 102, BSF-heterojunction layer 106, BSF-contact layer 109, heterojunction layer 103, and contact layer 104 have generally preferred depths within the EBAC solar cell 100, where here "depth" indicates dimensions in a direction parallel to the y-axis shown. In a particular embodiment, window layer 101 has a depth greater than or equal to 10 nm and less than or equal to 50 nm, absorption layer 102 has a depth greater than or equal to 500 nm and less than or equal to 2000 nm, BSF-heterojunction layer 106 has a depth greater than or equal to 10 nm and less than or equal to 50 nm, BSF-contact layer 109 has a depth greater than or equal to 10 nm and less than or equal to 50 nm, heterojunction layer 103 has a depth greater than or equal to 10 nm and less than or equal to 50 nm, and contact layer 104 has a depth greater than or equal to 10 nm and less than or equal to 50 nm. Further in a particular embodiment, heterojunction layer 103 is in contact with absorber layer 102 over an width $w_1$ and BSF-heterojunction layer 106 is in contact with absorber layer 102 over a width $w_2$, and $1.35<w_1/w_2<1.65$, $1.4<w_1/w_2<1.6$, $1.45<w_1/w_2<1.55$, or $1.48<w_1/w_2<1.52$, where $w_1$ and $w_2$ are dimensions in a direction parallel to the x-axis shown. Generally the $w_1/w_2$ is about 1.5 to maximize the number of minority carriers captured by the Emitter. In a particular embodiment, insulator gap 110 has a width $w_G$, and a $w_{Total}$ is equal $w_1+w_2+w_G$, and $(w_1+w_2)/w_{Total}>0.8$, 0.9, 0.95, or 0.98. Generally, $w_1/w_2$ is optimized to a ratio around 60/40 to maximize the number of minority carriers captured.

In a particular embodiment, absorption layer 102 has a depth greater than or equal to 800 nm. In another embodiment, absorption layer 102 has a depth less than or equal to 1600 nm. In a further embodiment, window layer 101, absorption layer 102, BSF-heterojunction layer 106, BSF-contact layer 109, heterojunction layer 103, and contact layer 104 have a depth less than or equal to 30 nm, and in an additional embodiment, window layer 101, absorption layer 102, BSF-heterojunction layer 106, BSF-contact layer 109, heterojunction layer 103, and contact layer 104 have a depth of greater than or equal to 15 nm and less than or equal to 25 nm. The impact of absorption layer 102 depth on EBAC solar cell 100 performance is indicated at Table 1, where selected parameters of the EBAC solar cell disclosed are indicated for varying depths of absorption layer 102, while window layer 101, absorption layer 102, BSF-heterojunction layer 106, BSF-contact layer 109, heterojunction layer 103, and contact layer 104 have depths of 20 nm.

Additionally in a particular embodiment, window layer 101 has a doping concentration $N_1$, absorption layer 102 has a doping concentration $N_2$, BSF-heterojunction layer 106 has a doping concentration $N_3$, and BSF-contact layer 109 has a doping concentration $N_4$, and $N_1 > N_2$, $N_3 > N_2$, and $N_4 > N_3$. In a particular embodiment, $2 \times (10^{18})$ cm$^{-3} < N_1 < 4 \times (10^{18})$ cm$^-$, $1 \times (10^{17})$ cm$^- < N_2 < 3 \times (10^{17})$ cm$^-$, $2 \times (10^{18})$ cm$^- < N_3 < 3 \times (10^{18})$ cm$^-$, and $8 \times (10^{18})$ cm$^- < N_4 < 1.2 \times (10^{19})$ cm$^{-3}$. In another embodiment, heterojunction layer 103 has a doping concentration $N_5$, and contact layer 104 has a doping concentration $N_6$, and $N_5 < N_6$. In a particular embodiment, $2 \times (10^{18})$ cm$^{-3} < N_5 < 4 \times (10^{18})$ cm$^{-3}$, and $8 \times (10^{18})$ cm$^{-3} < N_6 < 1.2 \times (10^{19})$ cm$^{-3}$. In certain embodiments, $N_2 < N_5$. Here and elsewhere "doping concentration" means the number of ions per cubic centimeter of the material, and is generally facilitated through foreign atoms incorporated into the crystal structure of the semiconductor. Various doping concentrations may be achieved through means known in the art. See e.g. M. McCluskey and E. Haller, *Dopants and Defects in Semiconductors* (2012), among others. In a particular embodiment, n-type GaAs or AlGaAs materials comprise a dopant of silicon, tin, selenium, tellurium, or sulfur. In another embodiment, p-type GaAs or AlGaAs materials comprise a dopant of zinc, beryllium, cadmium, magnesium, or carbon.

In certain embodiments, window layer 101 comprises $Al_xGa_{(1-x)}As$, heterojunction layer 103 comprises $Al_yGa_{(1-y)}As$, and BSF-heterojunction layer 106 comprises $Al_zGa_{(1-z)}As$. When absorption layer 102 comprises n-type material and heterojunction layer 103 comprises p-type material such that EBAC solar cell 100 is an n-on-p solar cell, and correspondingly window layer 101 and BSF-heterojunction layer 106 comprise n-type material, then x is typically about 0.3, y is typically about 0.7, and z is typically about 0.3. When absorption layer 102 comprises p-type material and heterojunction layer 103 comprises n-type material such that EBAC solar cell 100 is an p-on-n solar cell, and correspondingly window layer 101 and BSF-heterojunction layer 106 comprise p-type material, then x is typically about 0.7, y is typically about 0.3, and z is typically about 0.7. In certain embodiments, when EBAC solar cell 100 is an n-on-p solar cell, then $0.2 < x < 0.4$, preferably $0.25 < x < 0.35$, and more preferably $0.28 < x < 0.32$, and $0.6 < y < 0.8$, preferably $0.65 < y < 0.75$, and more preferably $0.68 < y < 0.72$, and $0.2 < z < 0.4$, preferably $0.25 < z < 0.35$, and more preferably $0.28 < z < 0.32$. In another embodiment when EBAC solar cell 100 is a p-on-n solar cell, then $0.6 < x < 0.8$, preferably $0.65 < x < 0.75$, and more preferably $0.68 < x < 0.72$, and $0.2 < y < 0.4$, preferably $0.25 < y < 0.35$, and more preferably $0.28 < y < 0.32$, and $0.6 < z < 0.8$, preferably $0.65 < z < 0.75$, and more preferably $0.68 < z < 0.72$.

In a particular embodiment, window layer 101 is at least 70 weight percent (wt. %), preferably at least 80 wt. %, and more preferably at least 90 wt. % AlGaAs. In another embodiment, absorption layer 102 is at least 70 wt. %, preferably at least 80 wt. %, and more preferably at least 90 wt. % GaAs. s. In another embodiment, heterojunction layer 103 is at least 70 wt. %, preferably at least 80 wt. %, and more preferably at least 90 wt. % AlGaAs. In another embodiment, contact layer 104 is at least 70 wt. %, preferably at least 80 wt. %, and more preferably at least 90 wt. % GaAs. In another embodiment, BSF-heterojunction layer 106 is at least 70 wt. %, preferably at least 80 wt. %, and more preferably at least 90 wt. % AlGaAs, and in a further embodiment, BSF-contact layer 109 is at least 70 wt. %, preferably at least 80 wt. %, and more preferably at least 90 wt. % GaAs. The various layers as disclosed in Emitter-less BAC solar cell 100 may be fabricated using any suitable means including bulk methods such as Czochralski and Bridgman methods, or epitaxial growth methods such as liquid phase epitaxy (LPE), chemical vapor deposition (CVD), molecular organic chemical vapor deposition (MOCVD) or molecular beam epitaxy (MBE), or any other suitable means known in the art.

In some embodiments, anti-reflective coating 108 comprises a wide-spectrum, four layer antireflective coating of $MgF_2/TiO_2/MgF_2/TiO_2$ with respective depths of generally about 100 nm/10 nm/20 nm/40 nm. Other arrangements known in the art for use as anti-reflective coatings may also be utilized. See e.g., Thosar et al., "Optimization of Antireflection Coating for Improving the Performance of GaAs Solar Cell," *Indian Journal of Science and Technology*, 7(5) (2014); see also Zhou et al, "Design of GaAs solar cell front surface anti-reflection coating," *Vehicular Electronics and Safety (ICVES)*, 2013 IEEE International Conference on (2013), among others.

Generally, when EBAC solar cell 100 is an n-on-p solar cell such that window layer 101, absorption layer 102, BSF-heterojunction layer 106 and BSF-contact layer 109 are n-type materials while heterojunction layer 103, and contact layer 104 are p-type materials, when an incident photon with sufficient energy refracts through window layer 101 into absorption layer 102, its energy may be transferred to an electron, effectively "freeing" the electron from its atomic (covalent) bond and leaving a "hole" behind in the crystal lattice—the electron and hole are often called an "electron-hole pair." The hole is termed the "minority carrier" because it exists within a n-type material that has many more electrons than holes. The hole may move about (diffuse) freely within the crystal lattice. If the hole diffuses to the vicinity of the electric field formed between window layer 101 and absorption layer 102, it is repelled away from the surface to prevent recombination. If the electron diffuses to the vicinity of the heterojunction layer, it travels through the external circuit as electric current. After completing its transit through the external circuit, the hole recombines with an electron in the crystal lattice, thus completing the cycle. For example, at FIG. 1, EBAC solar cell might generate current through the external circuit generally indicated at 111 and comprising load $R_L$ between second contact 105 and first contact 107.

Figure 2:
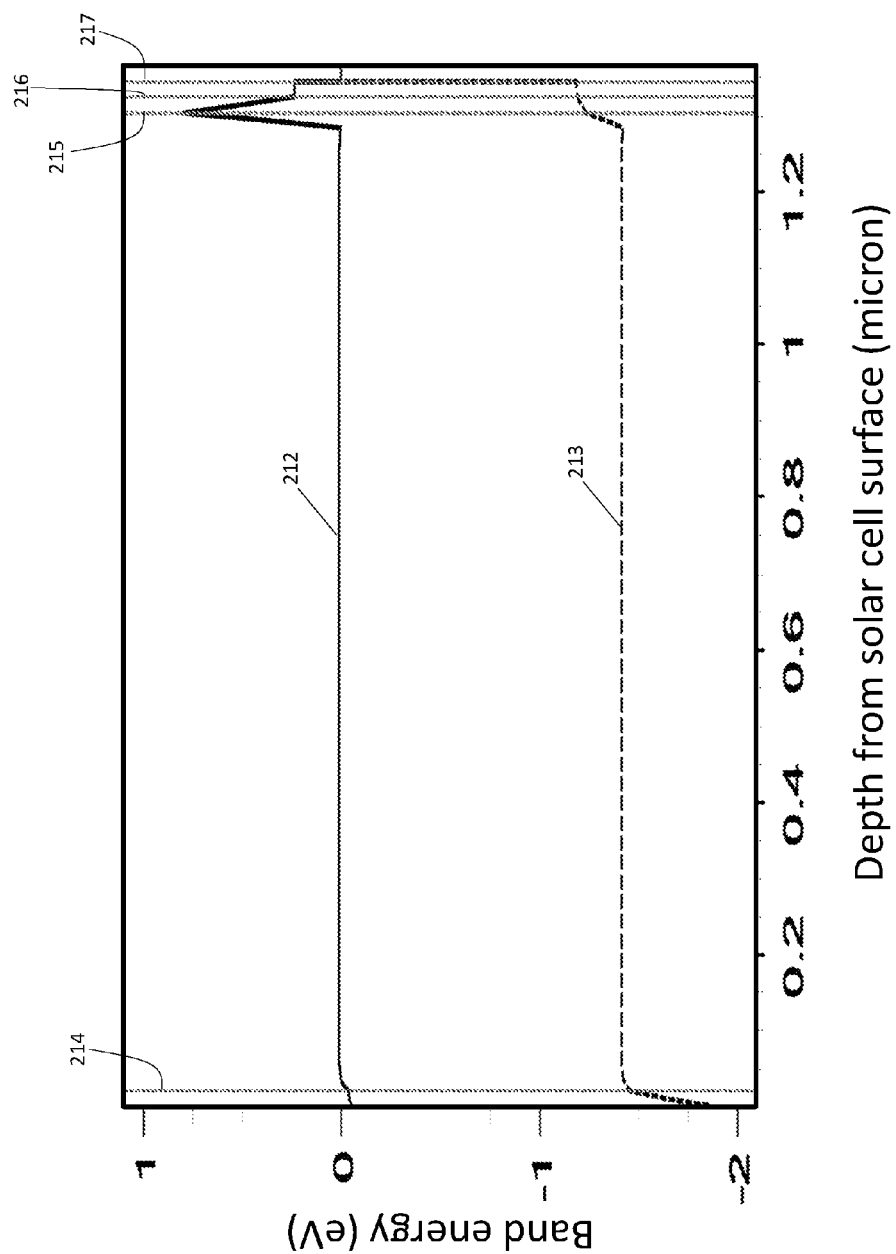
FIG. 2 illustrates Conduction Band (CB) and Valence Band (VB) level through one section of the EBAC solar cell.
Figure 3:
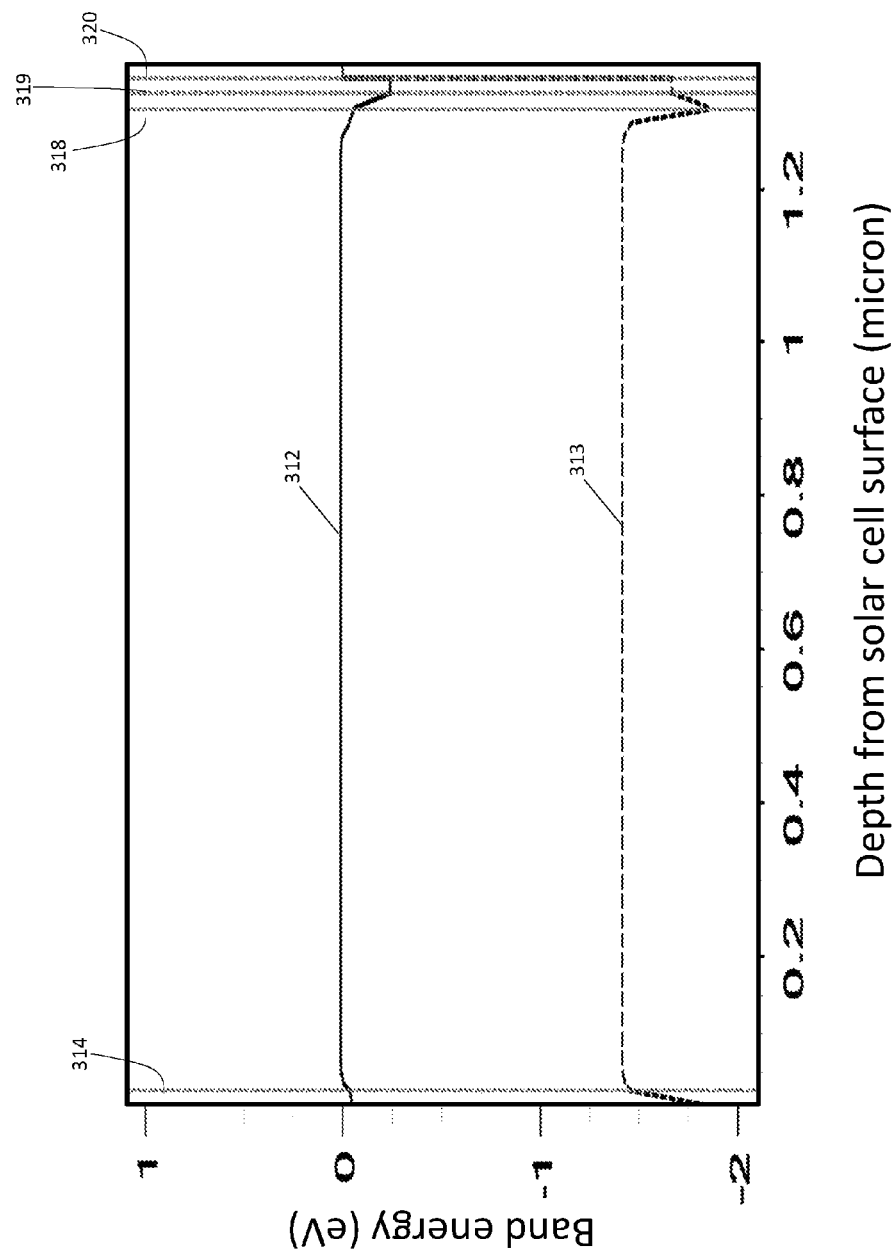
FIG. 3 illustrates Conduction Band (CB) and Valence Band (VB) level through another section of the EBAC solar cell.

The efficient performance of EBAC solar cell 100 is due in part to the absence of an emitter layer. The built-in voltage that an emitter layer provides to separate electron-hole-pairs (EHPs) near the surface subtracts from $V_{OC}$ and lowers efficiency. The EBAC solar cell does not include a p-n junction (emitter layer/absorption layer junction) because carrier diffusion lifetime is relatively high, the distance that carriers must travel to reach contacts is relatively low, and "selective" contacts are used. Selective contacts are Ohmic contacts interfaced with a wide band gap semiconductor to selectively allow holes or electrons to pass as shown in FIGS. 2 and 3. At FIG. 2, CB and VB eV levels for a particular embodiment of Emitter-less BAC Solar Cell 100 are illustrated versus layer depth, where CB is indicated as 212 and VB is indicated as 213, with the interface between window layer 101 and absorption layer 102 indicated as 214, the interface between absorption layer 102 and heterojunction 103 indicated as 215, the interface between heterojunction layer 103 and contact layer 104 indicated as 216, and the interface between contact layer 104 and second contact 105 as 217. Similarly, at FIG. 3, CB is indicated as 312 and VB is indicated as 313, with the interface between window layer 101 and absorption layer 102 indicated as 314, the interface between absorption layer 102 and BSF-heterojunction layer 106 indicated as 318, the interface between BSF-heterojunction layer 106 and BSF-contact layer 109 indicated as 319, and the interface between BSF-contact layer 109 and second contact 107 as 320. The absence of an emitter layer allows carriers to diffuse freely with a high probability of capture due to relatively long lifetimes and relatively short spans of travel. The diffusion gradient required to drive carriers to a contact is very small (~1 mV) which reduces $V_{OC}$ only slightly. Another benefit of an emitter-less solar cell is that the resulting structure shown in FIG. 1 does not have the characteristic "offset" of an alternating back-contact cell, and is therefore simpler to manufacture. A third benefit of this design is a 5% conversion efficiency improvement over prior art as demonstrated through simulation and device modeling using Silvaco ATLAS modeling software.

The design represented at FIG. 1 creates conditions that maximize the number of minority carriers that contribute to electric current. Since absorption layer 102 generally has a depth of only about 500-2000 nm, minority carriers have a much higher probability of reaching the electrical contacts and contributing to load current.

Further, the highly-reflective, back-surface, metal contacts 105 and 107 used in this embodiment improve solar cell efficiency. If photons fail to produce an electron-hole pair in absorption layer 102 during transit, they are reflected off the back-surface contacts and transit back into absorption layer 102, affording another opportunity to create an electron-hole pair. Photons spontaneously emitted during optical recombination may also reflect off the back-surface contacts and transit back into absorption layer 102 to create another electron-hole pair. This cycle may continue many times and is often termed "photon recycling." Additionally, window layer 101 and anti-reflective coating 108 are designed to minimize the "escape cone" out of the front of the solar cell, effectively "trapping" photons and increasing the probability that they will create an electron-hole pair.

The design represented at FIG. 1 additionally utilizes a strong selective front surface field generated by virtue of the AlGaAs-comprising window layer 101 and the GaAs-comprising absorption layer 102 which form a heterojunction interface. The respective doping levels generate a front surface field which significantly decreases front surface recombination velocity by forming an electric field and introducing a barrier to minority carriers flowing to the front surface. Hence carrier recombination is reduced at the front surface and the probability of carrier-collection at second contact 105 increases. The thin nature of absorption layer 102 allows the minority carriers created to travel to the second contact 105 with a minimum of recombination.

Thus, presented here is a novel emitter-less solar cell design featuring p-or-n type GaAs with alternating p-n junction regions on the back-surface of the cell, opposite incident solar irradiance. Various layers of p-or-n type GaAs are interfaced together to collect charge carriers, and a thin layer of AlGaAs is applied to the front and back surfaces to prevent recombination of charge carriers. Layer properties (thickness, material, doping, etc.) are generally optimized to improve overall conversion efficiency. Highly reflective, back-surface, metal contacts are used to reflect photons and improve optical and electrical performance. Other advantages include better long-term performance in high-radiation environments; higher conversion efficiency at elevated temperatures; and a lighter, more flexible structure for mobile applications.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention. It is intended that the scope of the invention be defined by the claims appended hereto.

In addition, the previously described versions of the present invention have many advantages, including but not limited to those described above. However, the invention does not require that all advantages and aspects be incorporated into every embodiment of the present invention.

All publications and patent documents cited in this application are incorporated by reference in their entirety for all purposes to the same extent as if each individual publication or patent document were so individually denoted.

TABLE 1

EBAC Solar Cell Performance

| Absorption Layer depth (nm) | Open Circuit Voltage ($V_{oc}$) (V) | Short-circuit current density ($J_{sc}$) (mA/cm$^2$) | Fill-factor (%) | Efficiency (%) |
|---|---|---|---|---|
| 500 | 1.2 | 27.1 | 89.4 | 28.0 |
| 600 | 1.2 | 28.0 | 89.3 | 28.8 |
| 700 | 1.1 | 28.7 | 89.3 | 29.4 |
| 800 | 1.1 | 29.2 | 89.3 | 29.8 |
| 900 | 1.1 | 29.5 | 89.2 | 30.0 |
| 1000 | 1.1 | 29.7 | 89.2 | 30.2 |
| 1100 | 1.1 | 29.9 | 89.2 | 30.3 |
| 1200 | 1.1 | 30.0 | 89.2 | 30.4 |
| 1300 | 1.1 | 30.1 | 89.1 | 30.4 |
| 1400 | 1.1 | 30.2 | 89.1 | 30.4 |
| 1500 | 1.1 | 30.2 | 89.1 | 30.4 |
| 1600 | 1.1 | 30.2 | 89.0 | 30.3 |
| 1700 | 1.1 | 30.2 | 89.0 | 30.3 |
| 1800 | 1.1 | 30.2 | 89.0 | 30.2 |
| 1900 | 1.1 | 30.2 | 89.0 | 30.1 |
| 2000 | 1.1 | 30.1 | 89.0 | 30.0 |

What is claimed is:

1. An Emitter-less, Back-surface, Alternating Contact (EBAC) solar cell comprising:
   a window layer comprising AlGaAs doped to a first conductivity type;
   an absorption layer contacting the window layer where the absorption layer comprises GaAs doped to the first conductivity type;
   a BSF-heterojunction layer contacting the absorption layer and separated from the window layer by the absorption layer, where the BSF-heterojunction layer comprises AlGaAs doped to the first conductivity type;
   a BSF-contact layer contacting the BSF-heterojunction layer and separated from the absorption layer by the BSF-heterojunction layer, where the BSF-contact layer comprises GaAs doped to the first conductivity type;

a first contact coupled to the BSF-contact layer and separated from the BSF-heterojunction layer by the BSF-contact layer;

a heterojunction layer contacting the absorption layer and separated from the window layer by the absorption layer, and displaced from the BSF-heterojunction layer, the BSF-contact layer, and the first contact, where the heterojunction layer comprises AlGaAs doped to a second conductivity type;

a contact layer contacting the heterojunction layer and separated from the absorption layer by the heterojunction layer, and the contact layer displaced from the BSF-heterojunction layer, the BSF-contact layer, and the first contact, where the contact layer comprises GaAs doped to the second conductivity type; and a second contact coupled to the contact layer and separated from the heterojunction layer by the contact layer.

2. The EBAC solar cell of claim 1 where:

a doping concentration of the GaAs comprising the absorption layer is less than a doping concentration of the AlGaAs comprising the window layer;

a doping concentration of the AlGaAs comprising the heterojunction layer is greater than a doping concentration of the GaAs comprising the absorption layer; and a doping concentration of the GaAs comprising the contact layer is greater than the doping concentration of the AlGaAs comprising the heterojunction layer.

3. The EBAC solar cell of claim 2 where:

a doping concentration of the AlGaAs comprising the BSF-heterojunction layer is greater than the doping concentration of the GaAs comprising the absorption layer; and a doping concentration of the GaAs comprising the BSF-contact layer is greater than the doping concentration of the AlGaAs comprising the BSF-heterojunction layer.

4. The EBAC solar cell of claim 3 where:

the doping concentration of the AlGaAs comprising the window layer is greater than $2\times(10^{18})$ cm$^{-3}$ and less than $4\times(10^{18})$ cm$^{-3}$;

the doping concentration of the GaAs comprising the absorption layer is greater than $1\times(10^{17})$ cm$^{-3}$ and less than $3\times(10^{17})$ cm$^{-3}$;

the doping concentration of the AlGaAs comprising the BSF-heterojunction layer is greater than $2\times(10^{18})$ cm$^{-3}$ and less than $3\times(10^{18})$ cm$^{-3}$;

the doping concentration of the GaAs comprising the BSF-contact layer is greater than $8\times(10^{18})$ cm$^{-3}$ and less than $1.2\times(10^{19})$ cm$^{-3}$;

the doping concentration of the AlGaAs comprising the heterojunction layer is greater than $2\times(10^{18})$ cm$^{-3}$ and less than $4\times(10^{18})$ cm$^{-3}$; and the doping concentration of the GaAs comprising the contact layer is greater than $8\times(10^{18})$ cm$^{-3}$ and less than $1.2\times(10^{19})$ cm$^{-3}$.

5. The EBAC solar cell of claim 3 where the window layer is at least 80 wt. % AlGaAs, the absorption layer is at least 80 wt. % GaAs, the heterojunction layer is at least 80 wt. % AlGaAs, the contact layer is at least 80 wt. % GaAs, the BSF-heterojunction layer is at least 80 wt. % AlGaAs, and the BSF-contact layer is at least 80 wt. % GaAs.

6. The EBAC solar cell of claim 1 where:

a depth of the window layer is greater than or equal to 10 nm and less than or equal to 50 nm;

a depth of the absorption layer is greater than or equal to 500 nm and less than or equal to 2000 nm;

a depth of the BSF-heterojunction layer is greater than or equal to 10 nm and less than or equal to 50 nm;

a depth of the BSF-contact layer is greater than or equal to 10 nm and less than or equal to 50 nm;

a depth of the heterojunction layer is greater than or equal to 10 nm and less than or equal to 50 nm; and a depth of the contact layer is greater than or equal to 10 nm and less than or equal to 50 nm.

7. The EBAC solar cell of claim 6 where:

the depth of the window layer is greater than or equal to 15 nm and less than or equal to 25 nm;

the depth of the absorption layer is greater than or equal to 800 nm and less than or equal to 2000 nm;

the depth of the BSF-heterojunction layer is greater than or equal to 15 nm and less than or equal to 25 nm;

the depth of the BSF-contact layer is greater than or equal to 15 nm and less than or equal to 25 nm;

the depth of the heterojunction layer is greater than or equal to 15 nm and less than or equal to 25 nm; and the depth of the contact layer is greater than or equal to 15 nm and less than or equal to 25 nm.

8. The EBAC solar cell of claim 6 where the first conductivity type is n-type and the second conductivity type is p-type, and where the window layer comprises $Al_xGa_{(1-x)}As$, the heterojunction layer comprises $Al_yGa_{(1-y)}As$, and the BSF-heterojunction layer comprises $Al_zGa_{(1-z)}As$, and where $0.25<x<0.35$, $0.65<y<0.75$, and $0.25<z<0.35$.

9. The EBAC solar cell of claim 6 where the first conductivity type is p-type and the second conductivity type is n-type, and where the window layer comprises $Al_xGa_{(1-x)}As$, the heterojunction layer comprises $Al_yGa_{(1-y)}As$, and the BSF-heterojunction layer comprises $Al_zGa_{(1-z)}As$, and where $0.65<x<0.75$, $0.25<y<0.35$, and $0.65<z<0.75$.

10. The EBAC solar cell of claim 6 where the heterojunction layer is in contact with the absorption layer over a width $w_1$ and the BSF-heterojunction layer is in contact with the absorption layer over a width $w_2$, and $1.4<w_1/w_2<1.6$.

11. The EBAC solar cell of claim 10 where the heterojunction layer is displaced from the BSF-heterojunction layer by an insulator gap having a width $w_G$, and where a width $w_{Total}$ is equal to $w_1+w_2+w_G$, and where $(w_1+w_2)/w_{Total}>0.9$.

12. An Emitter-less, Back-surface, Alternating Contact (EBAC) solar cell comprising:

a window layer comprising AlGaAs doped to a first conductivity type, where a doping concentration of the AlGaAs comprising the window layer is greater than $2\times(10^{18})$ cm$^{-3}$ and less than $4\times(10^{18})$ cm$^{-3}$, and where a depth of the window layer is greater than or equal to 10 nm and less than or equal to 50 nm;

an absorption layer contacting the window layer where the absorption layer comprises GaAs doped to the first conductivity type, where a doping concentration of the GaAs comprising the absorption layer is greater than $1\times(10^{17})$ cm$^{-3}$ and less than $3\times(10^{17})$ cm$^{-3}$, and where a depth of the absorption layer is greater than or equal to 500 nm and less than or equal to 2000 nm;

a BSF-heterojunction layer contacting the absorption layer and separated from the window layer by the absorption layer, where the BSF-heterojunction layer comprises AlGaAs doped to the first conductivity type, where a doping concentration of the BSF-heterojunction layer is greater than $2\times(10^{18})$ cm$^{-3}$ and less than $3\times(10^{18})$ cm$^{-3}$, and where a depth of the window layer is greater than or equal to 10 nm and less than or equal to 50 nm;

a BSF-contact layer contacting the BSF-heterojunction layer and separated from the absorption layer by the BSF-heterojunction layer, where the BSF-contact layer comprises GaAs doped to the first conductivity type, where a doping concentration of the GaAs comprising the BSF-contact layer is greater than $8\times(10^{18})$ cm$^{-3}$ and less than $1.2\times(10^{19})$ cm$^{-3}$, and where a depth of the BSF-heterojunction layer is greater than or equal to 10 nm and less than or equal to 50 nm;

a first contact coupled to the BSF-contact layer and separated from the BSF-heterojunction layer by the BSF-contact layer;

a heterojunction layer contacting the absorption layer and separated from the window layer by the absorption layer, and the heterojunction layer displaced from the BSF-heterojunction layer, the BSF-contact layer, and the first contact, where the heterojunction layer comprises AlGaAs doped to a second conductivity type, where a doping concentration of the AlGaAs comprising the heterojunction layer is greater than $2\times(10^{18})$ cm$^{-3}$ and less than $4\times(10^{18})$ cm$^{-3}$, and where a depth of the heterojunction layer is greater than or equal to 10 nm and less than or equal to 50 nm;

a contact layer contacting the heterojunction layer and separated from the absorption layer by the heterojunction layer, and the contact layer displaced from the BSF-heterojunction layer, the BSF-contact layer, and the first contact, where the contact layer comprises GaAs doped to the second conductivity type, where a doping concentration of the GaAs comprising the contact layer is greater than $8\times(10^{18})$ cm$^{-3}$ and less than $1.2\times(10^{19})$ cm$^{-3}$, and where a depth of the contact layer is greater than or equal to 10 nm and less than or equal to 50 nm; and a second contact coupled to the contact layer and separated from the heterojunction layer by the contact layer.

13. The EBAC solar cell of claim 12 where the heterojunction layer is in contact with the absorption layer over a width $w_1$, the BSF-heterojunction layer is in contact with the absorption layer over a width $w_2$, and the heterojunction layer is displaced from the BSF-heterojunction layer by an insulator gap having a width $w_G$, and where $1.4<w_1/w_2<1.6$ and $(w_1+w_2)/(w_1+w_2+w_G)>0.9$.

14. The EBAC solar cell of claim 13 where the first conductivity type is n-type and the second conductivity type is p-type, and where the window layer comprises $Al_xGa_{(1-x)}As$, the heterojunction layer comprises $Al_yGa_{(1-y)}As$, and the BSF-heterojunction layer comprises $Al_zGa_{(1-z)}As$, and where $0.25<x<0.35$, $0.65<y<0.75$, and $0.25<z<0.35$.

15. The EBAC solar cell of claim 13 where the first conductivity type is p-type and the second conductivity type is n-type, and where the window layer comprises $Al_xGa_{(1-x)}As$, the heterojunction layer comprises $Al_yGa_{(1-y)}As$, and the BSF-heterojunction layer comprises $Al_zGa_{(1-z)}As$, and where $0.65<x<0.75$, $0.2<y<0.4$, and $0.65<z<0.75$.

16. The EBAC solar cell of claim 15 where:

the depth of the window layer is greater than or equal to 15 nm and less than or equal to 25 nm;

the depth of the absorption layer is greater than or equal to 800 nm and less than or equal to 2000 nm;

the depth of the BSF-heterojunction layer is greater than or equal to 15 nm and less than or equal to 25 nm;

the depth of the BSF-contact layer is 15 nm and less than or equal to 25 nm;

the depth of the heterojunction layer is 15 nm and less than or equal to 25 nm; and the depth of the contact layer is 15 nm and less than or equal to 25 nm.

* * * * *